350-332 SR

6/19/79 XR 4,158,786

United States Patent [19]

Hirasawa

[11] 4,158,786

[45] Jun. 19, 1979

[54] DISPLAY DEVICE DRIVING VOLTAGE PROVIDING CIRCUIT

[75] Inventor: Masataka Hirasawa, Ayase, Japan

[73] Assignee: Tokyo Shibaura Electric Co., Ltd., Japan

[21] Appl. No.: 818,295

[22] Filed: Jul. 22, 1977

[30] Foreign Application Priority Data

Jul. 27, 1976 [JP] Japan .................................. 51-89462
Aug. 3, 1976 [JP] Japan .................................. 51-92454

[51] Int. Cl.$^2$ .......................... H03K 1/00; G06F 3/14

[52] U.S. Cl. .................................. 307/296 R; 307/24; 307/251; 307/270; 340/802; 350/332

[58] Field of Search ................. 307/24, 31, 32, 36–38, 307/270, 296, 251; 340/324 M, 336; 58/50 R; 350/330, 331, 332, 333

[56] References Cited

U.S. PATENT DOCUMENTS

| | | | |
|---|---|---|---|
| 3,195,011 | 7/1965 | Polin | 58/50 R |
| 3,896,430 | 7/1975 | Hatsukano | 340/336 |
| 3,903,518 | 9/1975 | Hatsukano | 340/336 |
| 3,936,676 | 2/1976 | Fujita | 307/209 X |
| 3,949,242 | 4/1976 | Hirasawa et al. | 307/209 X |
| 3,988,616 | 10/1976 | Shimada | 350/332 X |
| 4,019,178 | 4/1977 | Hashimoto et al. | 350/332 X |
| 4,038,564 | 7/1977 | Hakata | 340/336 X |
| 4,050,064 | 9/1977 | Hashimoto et al. | 350/332 X |
| 4,060,802 | 11/1977 | Matsuki | 340/336 X |

*Primary Examiner*—Larry N. Anagnos
*Attorney, Agent, or Firm*—Finnegan, Henderson, Farabow & Garrett

[57] ABSTRACT

A voltage dividing circuit provides an intermediate level potential or intermediate level potentials between the maximum and minimum level potentials necessary for dynamic- or scanning-driving a liquid crystal display device. The voltage dividing circuit includes at least one insulated gate field effect transistor and a plurality of resistive elements each with relatively small resistance connected in series between power source terminals. The insulated gate field effect transistor is enabled during a fixed time interval at the initial stage of one display cycle to provide drive voltage to the liquid crystal display device with low output resistance. A first dividing circuit including low resistive elements enabled by an insulated gate field effect transistor or transistors may be connected in parallel with a second dividing circuit including relatively high resistive elements which provides the intermediate level potential or potentials with the same level as of the first dividing circuit.

17 Claims, 12 Drawing Figures

DISPLAY DEVICE DRIVING VOLTAGE PROVIDING CIRCUIT

BACKGROUND OF THE INVENTION

The present invention relates to a circuit arrangement for generating an intermediate level potential between the maximum and minimum level potentials necessary to dynamically drive the display device.

A recent design tedency of diverse digital electronic apparatuses as typified by an electronic desk-top calculator is to miniturize the apparatus size and to reduce the power consumption of the apparatuses, by using integrated circuits comprising p- or n-channel insulated gate field effect transistors (IGFET or MOST) and a liquid crystal display device.

Because of chemical characteristic of the liquid crystal, the AC voltage driving system is preferable in order to elongate the life of the liquid crystal display device. When the dynamic drive or scanning drive system is employed, it is necessary to prebias the liquid crystal display segments at the intermediate potential level between the maximum and minimum potential levels which are displaying levels, since the response of the liquid crystal display device is slower than those of other type display devices. To provide an intermediate level potential or potentials a prior art LC display device uses a resistive voltage dividing circuit through which current always flows. Therefore, power dissipation of the dividing circuit or display device becomes necessarily large. Application of large resistance value elements to the dividing circuit so as to reduce the power dissipation is not desirable since the liquid crystal is capacitive.

SUMMARY OF THE INVENTION

Accordingly, the object of the present invention is to provide a circuit arrangement for providing a display device drive voltage which is low in power dissipation and suitable for integrated circuit version.

According to the present invention, there is provided a circuit arrangement for generating an intermediate level potential between the maximum and the minimum level potentials necessary for dynamic-driving a display device comprising: a first power source terminal for providing the maximum level potential; a second power source terminal for providing the minimum level potential; a plurality of first resistive elements connected in series between the first and second power source terminals for providing the intermediate level potential or potentials from a connection point or connection points between the first resistive elements; at least one first insulated gate field effect transistor connected in series with the first resistive elements between the first and second power source terminals; and control means for turning on the first field effect transistor during a fixed interval at the initial stage of each display cycle.

Other objects and features of the invention will be apparent from the following description taken in connection with the accompanying drawings, in which:

DETAILED DESCRIPTION OF THE PREFERRED EMBODIMENTS

Figure 1:
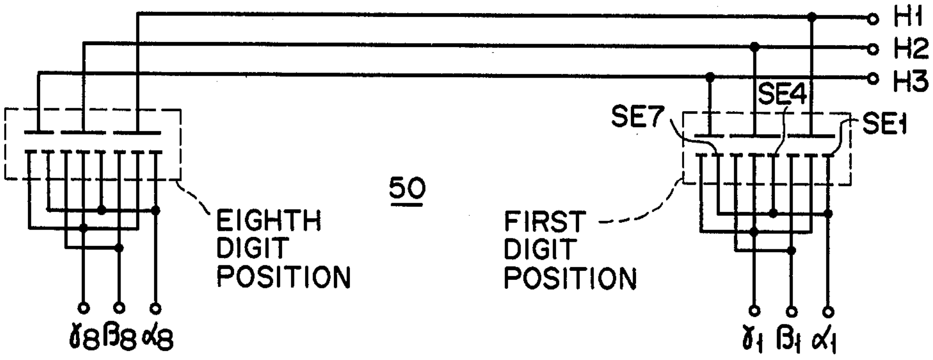
FIG. 1 shows an example of wiring diagrams of a liquid crystal display device.
Figure 2:
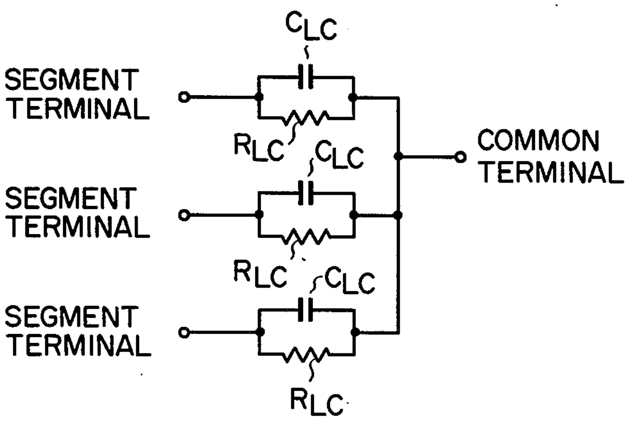
FIG. 2 shows an equivalent circuit of the liquid crystal display device.

Referring now to FIG. 1, there is shown an eight digit LC display device by $\frac{1}{3}$ duty and $\frac{1}{3}$ prebias system in which each digit display section includes eight numeral display segments one of which is a decimal point segment and three common electrodes. Scanning pulses H1, H2 and H3 are applied to the three common electrodes of each digit, respectively. The segment electrodes of each digit are divided into three groups to which data signals $\gamma$, $\beta$ and $\alpha$ are applied. FIG. 2 shows an equivalent circuit of the liquid crystal display device for one common electrode of a single digit section of the display device. $C_{LC}$ is a capacitance of the liquid crystal usually of several pF to several tens of pF per segment. $R_{LC}$ designates a leakage resistance of more than 100 MΩ.

Figure 3:
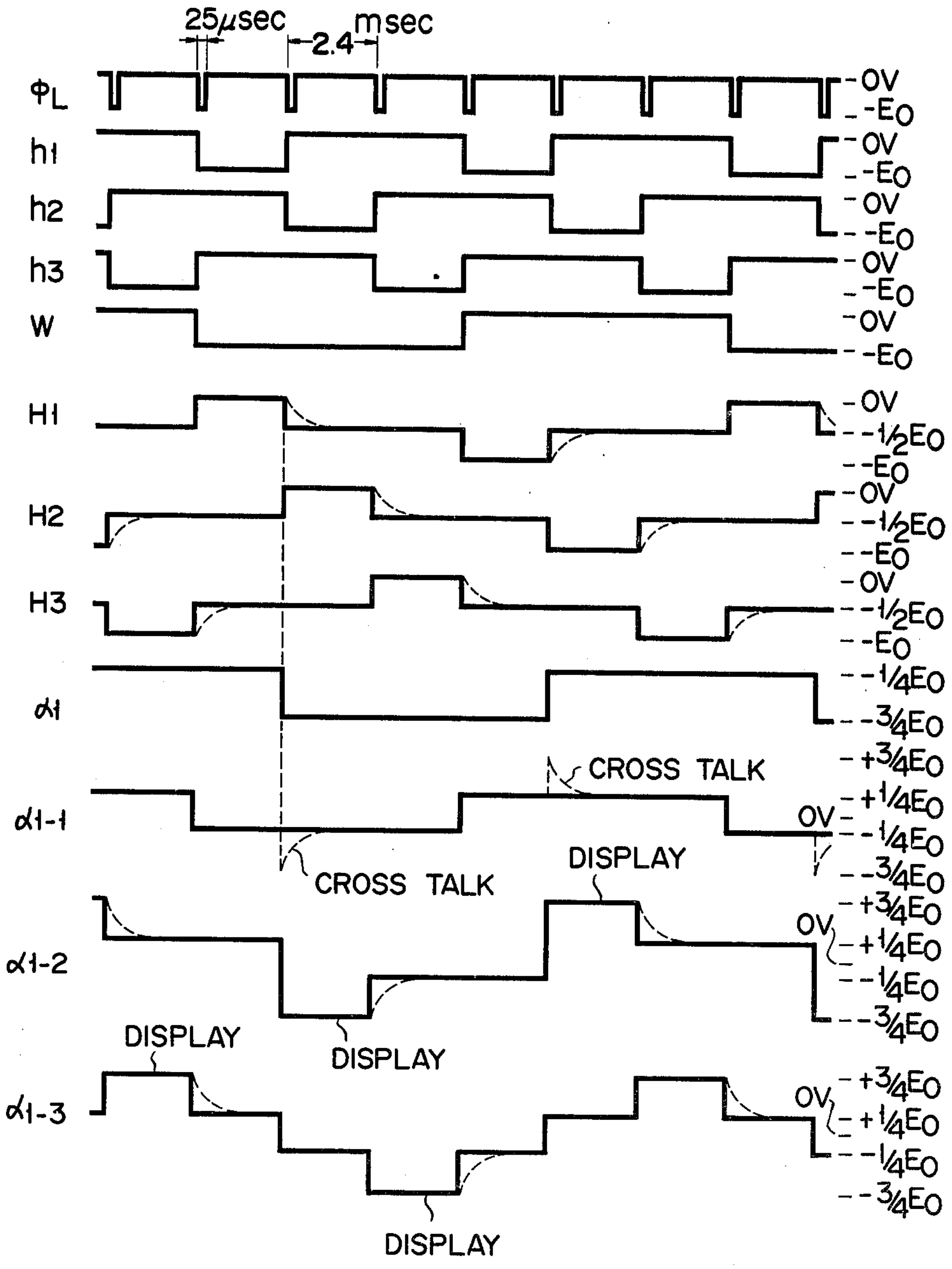
FIG. 3 is a set of timing diagrams useful in explaining the operation of the display device shown in FIG. 1.
Figure 4:
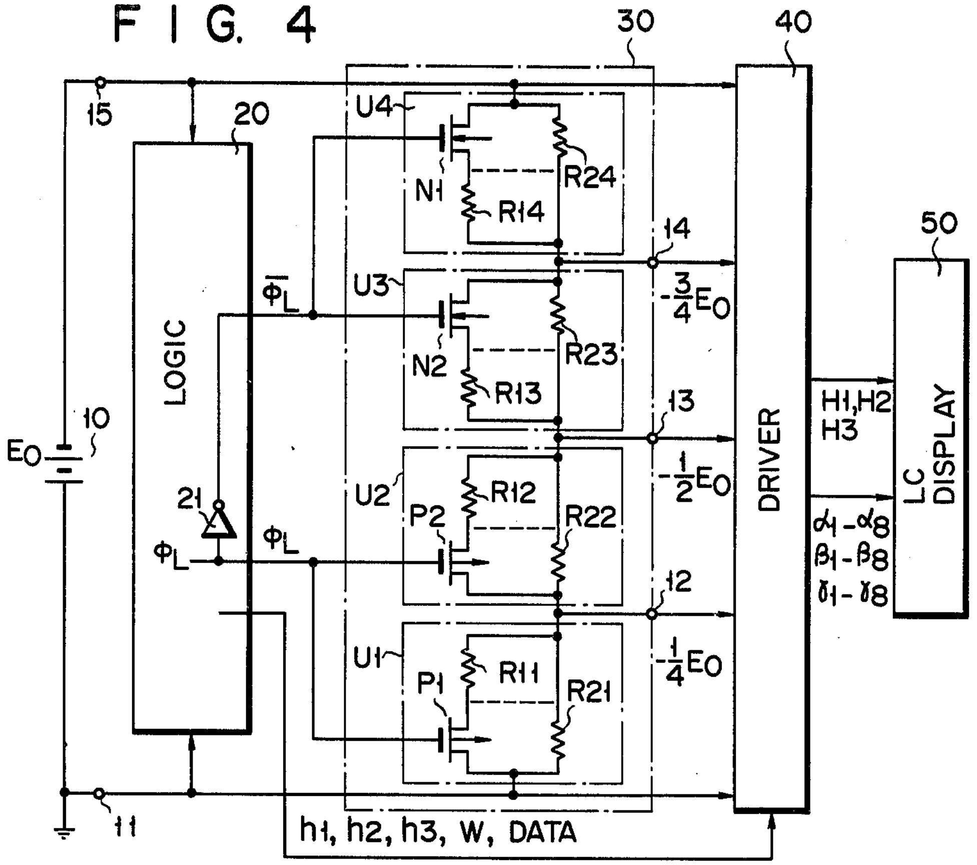
FIG. 4 shows a schematic circuit diagram of an electronic apparatus including a voltage dividing circuit which is an embodiment of the invention.

FIG. 3 shows a set of waveforms of signals for driving the liquid crystal display device of FIG. 1 and FIG. 4 shows a schematic diagram of an electronic digital apparatus such as an electronic desk-top calculator including an intermediate potential level generating circuit of an embodiment according to the present invention. In FIG. 4, reference numeral 10 designates a DC power source such as a battery connected between the power supply terminals 11 and 15 of an integrated circuit. In this example, a potential level applied to the power supply terminal 11 is 0 volt and a low potential level applied to the power supply terminal 15 is −Eo volt. Reference numeral 20 denotes a logic unit operating between 0 volt and −Eo volt and including a basic timing signal generator for LC display, a decoder circuit for converting a data signal of BCD code into a segment signal for driving each LC segment, a clock circuit of an electronic clock and/or an arithmetic unit of a desk-top electronic calculator, and the like. A drive voltage generating circuit or a voltage dividing circuit is designated by reference numeral 30. The voltage dividing circuit 30 comprises four dividing units U1 to U4 connected in series between the supply terminals 11 and 15 and each including a parallel combination of a series circuit having a first resistive element and first IGFET or MOST with a second resistive element with larger resistance than that of the first resistive element. The first resistive elements are designated by R11 to R14 and the second resistive elements are designated by R21 to R24. MOSTs P1 and P2 in the dividing units U1 and U2 are of p-channel type and MOSTs N1 and N2 in the dividing units U3 and U4 are of n-channel type. Pulse $\phi_L$ from the circuit 20 to be described later is fed to the gates of p-channel MOSTs P1 and P2 and the complement pulse $\bar{\phi}_L$ from an inverter 21 is fed to the gates of MOSTs N1 and N2. This application of the pulses cause the MOSTs N1, N2, P1 and P2 to simultaneously turn on or off. The first resistive elements R11 to R14 have an equal resistance value and the same thing is true for the resistive elements R21 to R24.

With this arrangement, intermediate potentials $-\frac{1}{4}Eo$, $-\frac{1}{2}Eo$ and $-\frac{3}{4}Eo$ are derived from the junction points 12, 13 and 14 between adjacent units. The second resistive elements R21 to R24 each may be connected in parallel with only the corresponding MOST, as indicated by dotted lines.

Figure 5:
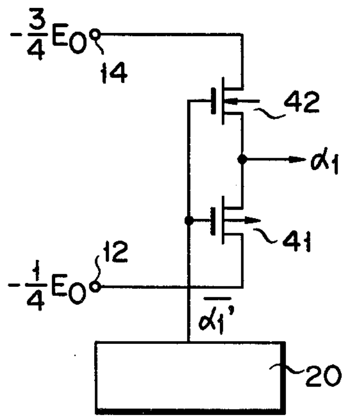
FIGS. 5 and 6 show circuit diagrams of a part of the driver circuit of FIG. 4.
Figure 6:
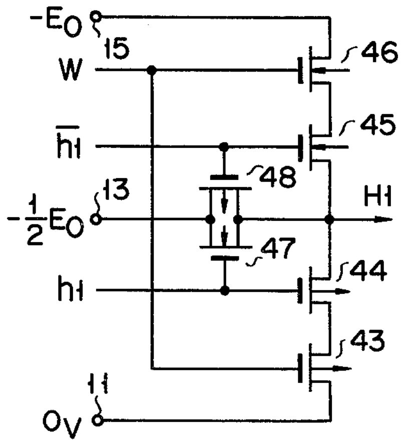

Reference numeral 40 designates an LC driving circuit for generating signals H1 to H3, $\beta_1$ to $\beta_8$, $\gamma_1$ to $\gamma_8$ and $\alpha_1$ to $\alpha_8$ for driving the LC display 50. This circuit 40 is provided with circuits for generating segment drive signals as shown in FIG. 5 and other circuits as shown in FIG. 6 for generating scanning signals H1, H2 and H3. The circuit shown in FIG. 5 is an inverter circuit comprising complementary MOSTs 41 and 42 connected in series between the output terminals 12 and 14 of the voltage dividing circuit 30. The commonly connected gates of MOSTs 41 and 42 receive a signal $\alpha'_1$ changing between 0 and $-Eo$ volt delivered from the circuit 20 to generate a segment drive signal $\alpha_1$, for example. The circuit shown in FIG. 6 comprises complementary MOSTs 43 to 46 connected in series between the power supply terminals 11 and 15, and a transmission gate including complementary MOSTs 47 and 48 which is connected between the junction point of MOSTs 44 and 45 and the output 13 of the voltage dividing circuit 30. The circuit 20 applies a signal $\overline{\mathbf{h1}}$ to the gates of MOSTs 45 and 48, a signal h1 to the gates of MOSTs 44 and 47, and a signal w to the gates of MOSTs 43 and 46, with the result that the circuit of FIG. 6 produces the scanning pulse H1. The scanning pulse H1 takes $-Eo$ volt level when both the MOSTs 45 and 46 are rendered conductive; 0 volt level when both the MOSTs 43 and 44 are rendered conductive; and $-\frac{1}{2}Eo$ volt level when both the MOSTs 44 and 45 are rendered nonconductive and both the MOSTs 47 and 48 are rendered conductive.

In FIG. 3, the signal $\phi_L$ is pulsed for a predetermined period at the initial stage of one display cycle and used for defining one display cycle. The desirable period of the pulse $\phi_L$ depending on the characteristic of the liquid crystal is typically 2.4 msec. The pulse width of $\phi_L$ in this example is 25 μsec. The pulses h1, h2 and h3 define the scanning timings of the scanning pulses H1, H2 and H3, respectively. For example, when the pulse h1 is at $-Eo$ volt, the pulse H1 is set at a display enabling level or a selection level of either 0 volt or $-Eo$ volt. When the pulse h1 is at 0 volt level, the scanning pulse H1 is set at the non-selection level of $-\frac{1}{2}Eo$. The pulse w defines the polarity of the selection level of the scanning pulses H1 to H3 and the polarity of the segment signals. When the pulse w is at $-Eo$ volt, the selection level of the scanning pulses H1 to H3 is 0 volt. When it is at 0 volt, the selection level is $-Eo$ volt. Each segment signal changes between $-\frac{3}{4}Eo$ and $-\frac{1}{4}Eo$ level. When the pulse w is at $-E$ volt, $-\frac{3}{4}Eo$ of the segment signal represents the display level and when it is at 0 volt, $-\frac{1}{4}Eo$ level of the segment signal represents the display level. Waveforms $\alpha_{1\text{-}1}$, $\alpha_{1\text{-}2}$ and $\alpha_{1\text{-}3}$ respectively represent voltages applied between the segment Se1 and the H1 receiving common electrode, between the segment SE4 and the H2 receiving common electrode, and between the segment SE7 and the H3 receiving common electrode. In this case, the segment SE1 is not displayed while the segments SE4 and SE7 are displayed.

The condition required for the LC scanning waveforms is that the output resistances of the scanning waveform generating circuit at the respective levels are negligibly small compared with a resultant leakage resistance of the LC display device driven by a scanning pulse. Otherwise, the voltage applied across the LC is reduced. For example, in the eight digit display device, since the scanning pulse H1 simultaneously drives 24 segments (3×8), the resultant leakage resistance will be about 10 MΩ (≈300/24) if the leakage resistance per segment is approximately 300 MΩ. Therefore, up to approximately 400 KΩ will be permitted for the output resistance value. More larger resistance value may be permissible for the output resistance of the segment drive signal generating circuit since the number of segment electrodes commonly driven by a segment signal is far less than that of segment electrodes commonly driven by a scanning signal.

Since the LC is capacitive, the switching characteristic of the scanning pulse must be good. When the LC capacitance $C_{LC}$ per segment is about 50 pF, each scanning pulse must drive simultaneously approximately 1,000 pF (50×24). For this reason, in order to shorten sufficiently the switching time, it is necessary that the output resistance is sufficiently low at least at the instant of switching. For example, assuming that the output resistance is 400 KΩ when the scanning pulse H1 is switched from 0 volt or $-Eo$ volt to $-\frac{1}{2}Eo$ volt. Then the waveform of the scanning pulse H1 changes according to the time constant 400 μsec.=400 KΩ×1,000 pF as shown by the dotted line. The time constant makes the waveform $\alpha_{1\text{-}1}$ change as shown by the dotted line. In this case, if the voltage $\alpha_{1\text{-}1}$ retains a level close to the display level $-\frac{3}{4}Eo$ or $+\frac{3}{4}Eo$ for a relatively long time, the segment SE1 not to be displayed is displayed faintly. That is, a so-called cross talk phenomenon occurs.

Figure 7:
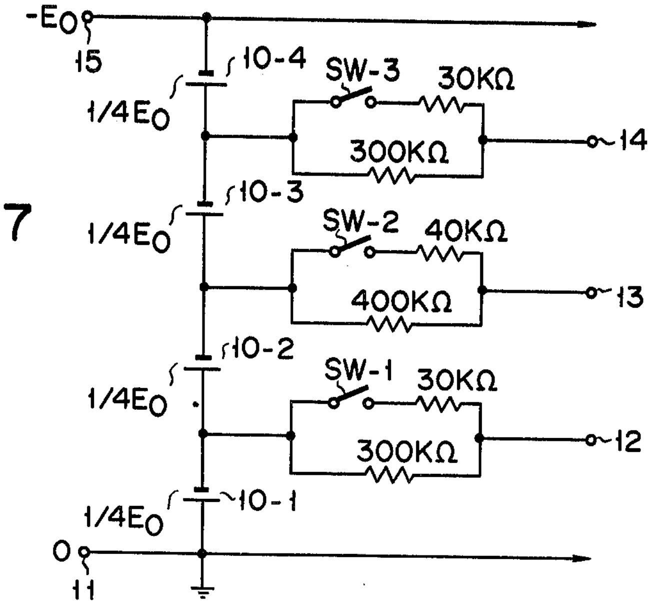
FIG. 7 shows an equivalent circuit of the voltage dividing circuit shown in FIG. 4.

FIG. 7 shows an equivalent circuit of the voltage dividing circuit of FIG. 4 which is obtained by Thevenin's theory when R11=R12=R13=R14≈40 KΩ and R21=R22=R23=R4≈400 KΩ. Switches SW-1 to SW-3 are turned on when the MOSTs P1, P2, N1 and N2 in FIG. 4 are enabled for 25 μsec. by the pulses $\phi_L$ and $\overline{\phi_L}$, and turned off when the MOSTs are disabled. As seen from the figure, the output resistance, at the instant that the scanning pulse is switched from 0 V or $-EoV$ to $-\frac{1}{2}EoV$, is presented by the parallel value of 40 KΩ and 400 KΩ and the output resistance, at the instant that the drive signal is switched, is presented by the parallel value of 30 KΩ and 300 KΩ. The time delay of the scanning pulse at the switching time thereof is approximately 40 μsec. (=40 KΩ×1,000 pF) which is sufficient to improve the improper display of the segment due to the cross talk phenomenon as mentioned referring to the segment SE1 in FIG. 3. After the MOSTs P1, P2, N1 and N2 are turned off, the output resistances of the scanning signal and the segment drive signal are 300 KΩ and 400 KΩ, thus permitting application of a desired voltage to the LC.

In a dynamic display system, 3 V or 4.5 V is used for the power source voltage Eo, for the purpose of reducing the power consumption. In the case of Eo=−4.5 V, the average dissipation current in the dividing circuit 30 is about 3.3 μA. The dissipation current of the logic unit 20 is generally several tens μA to 200 μA.

Figure 8:
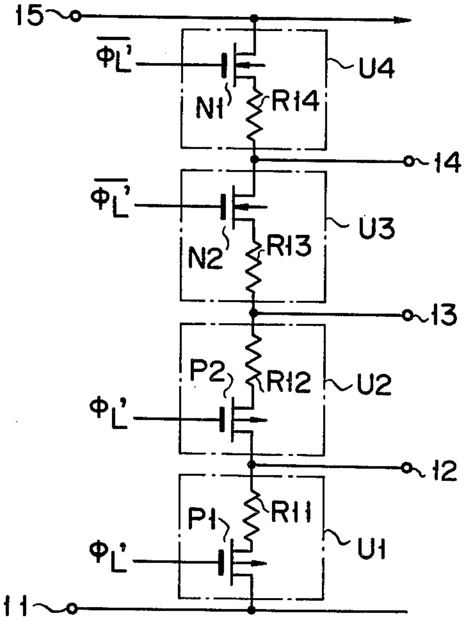
FIGS. 8 to 12 show other embodiments of the voltage dividing circuit according to the invention.

Since LC is capacitive, the modification as shown in FIG. 8 is possible. When the pulses $\phi'_L$ and $\overline{\phi'_L}$ having a period, for example, 500 μsec, which is much shorter than the time constant of LC and a pulse width of, for example, 25 μsec. are applied to the gates of MOSTs P1, P2, N1 and N2, the second resistive elements R21 to R24 may be omitted. In this case, the consumption current is approximately 1.5 μA for Eo=4.5 V. A digit pulse or bit pulse usually used in electronic digital apparatus may be employed as the pulse $\phi'_L$.

Figure 9:
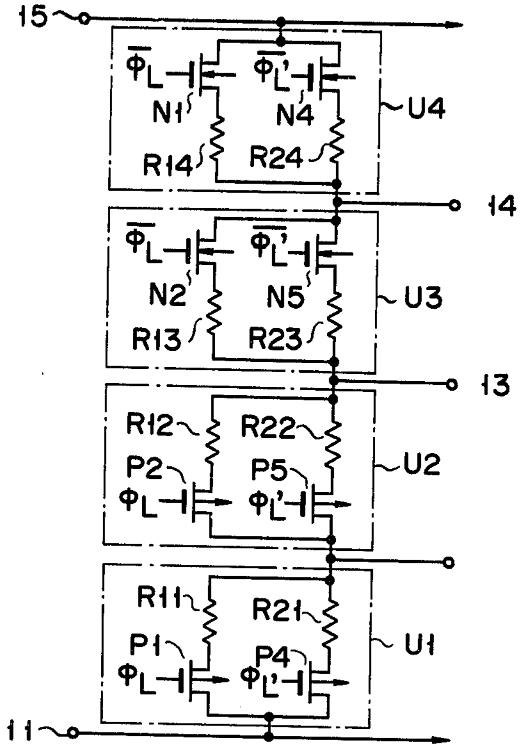

As example shown in FIG. 9 is operable with less power consumption than that of the FIG. 8 case. In this example, MOSTs P4, P5, N4 and N5 are connected in series to the respective second resistive elements as shown in FIG. 9. With such a circuit connection pulses $\phi'_L$ and $\overline{\phi'_L}$ are applied to the gates of these MOSTs, as shown. An average value of dissipation current of this embodiment is about 1 μA where the pulses $\phi'_L$ and $\overline{\phi'_L}$ have a period of 100 μsec. and a pulse width of 25 μsec.

In the above-mentioned embodiments, the first resistive elements R11 to R14 are equal to each other and this is true in the second resistive elements R21 to R24. These resistance values, however, may be properly selected, if necessary. For example, when R11=R12=R13+R14 and R21=R22=R23+R24, $-\frac{1}{3}$Eo appears at the terminal 12, $-\frac{2}{3}$Eo at the terminal 13, and −5/6Eo at the terminal 14. The above-mentioned embodiments may be modified as below. A p-channel MOST is connected in parallel with the unit U1 and an n-channel MOST in parallel with the unit U4 and, for example, $\overline{W}$ is applied to these additional MOSTs. In this case, the scanning pulses H1 to H3 and segment signals each having four potential levels (ground, $-\frac{1}{3}$Eo, $-\frac{2}{3}$Eo, −Eo) can be obtained.

In the voltage dividing circuit mentioned above, three intermediate level potentials are produced by using four dividing units. When N (2, 3, 4 . . . ) of the dividing units are used, the N-1 potential levels can be obtained. If only the dividing units U2 and U3 of the FIG. 4 embodiment are connected between the power source terminals 11 and 15, one intermediate level potential ($-\frac{1}{2}$Eo) for scanning pulse is obtained. In this case, the segment signal applied to the segment electrodes may take the potential between 0 V and −EoV. The dividing circuit of N=2 is suitable for $\frac{1}{2}$ duty and $\frac{1}{2}$ prebias system for the LC display device.

Figure 10:
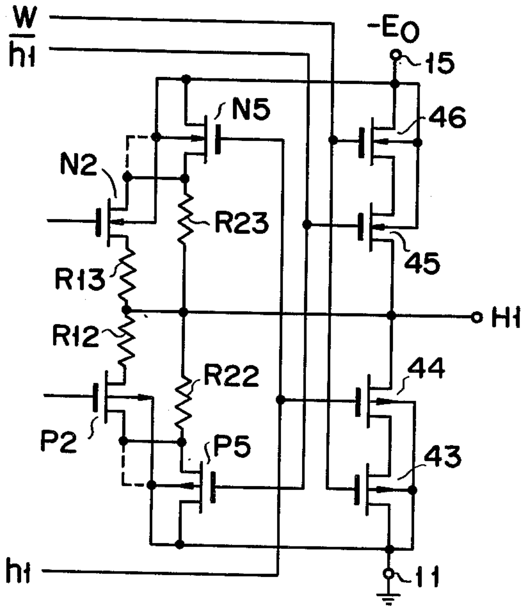

FIG. 10 shows an example of the voltage dividing circuit in the case of N=2. In this embodiment, the gates of second MOSTs N5 and P5 are connected to receive the pulses h1 and $\overline{h1}$, respectively and thus are enabled only during the non-display period. The voltage dividing circuit can be directly coupled to the driver circuit including MOSTs 43 to 46. The series connection of MOSTs N2 and P2 and resistive elements R12 and R13 may be connected in parallel with the series connection of MOSTs N5 and P5 and resistive elements R22 and R23 as shown by dashed lines. To reduce power dissipation, the series connection of MOST N2 and resistive element R13 may be connected in parallel with resistive element R23 and in series with MOST N5, and the series connection of MOST P2 and resistive element R12 may be connected in parallel with resistive element R22 and in series with MOST P5 as shown.

Figure 11:
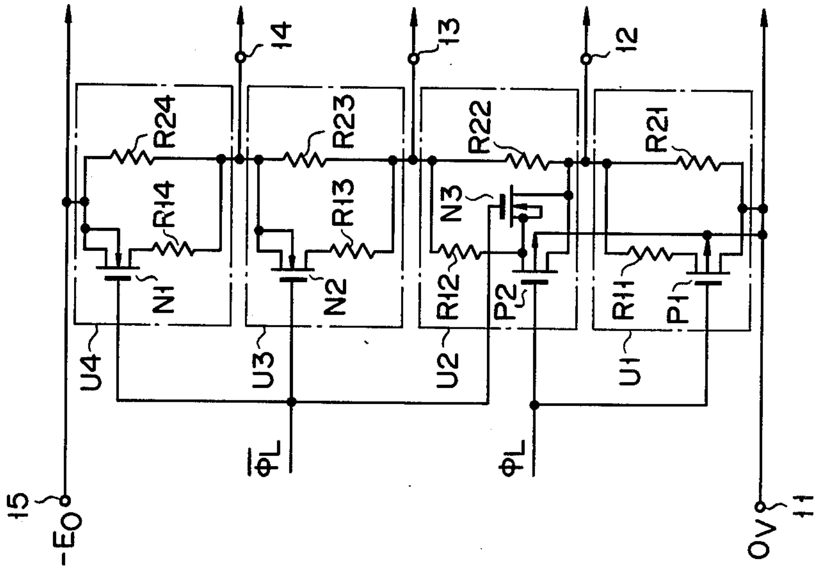

The voltage dividing circuits heretofore described may be easily integrated on a semiconductor chip together with logic circuits. FIG. 11 shows a voltage dividing circuit having the construction similar to that of FIG. 4 and suitable for integrated circuit construction. For example, in case where MOSTs are formed on an n-type semiconductor body, the substrate electrodes or back gate electrodes of N1 and N2 are connected to the sources closer to the corresponding power source terminal 15 for low potential, thereby eliminating the well known back gate bias effect. In the case of the MOST of p-channel incapable of eliminating the back gate bias effect, the n-channel MOST N3 the back gate electrode of which is connected to the source at the side of the power source terminal 15, is connected in parallel with the MOST P2 for compensating for the characteristic deterioration of the MOST P2. That is, such the connection reduces the ON resistance of the MOST P2. The back gate electrodes of the p-channel MOSTs P1 and P2 are grounded. The voltage dividing circuit shown in FIG. 11 is suitable for low voltage operation.

Figure 12:
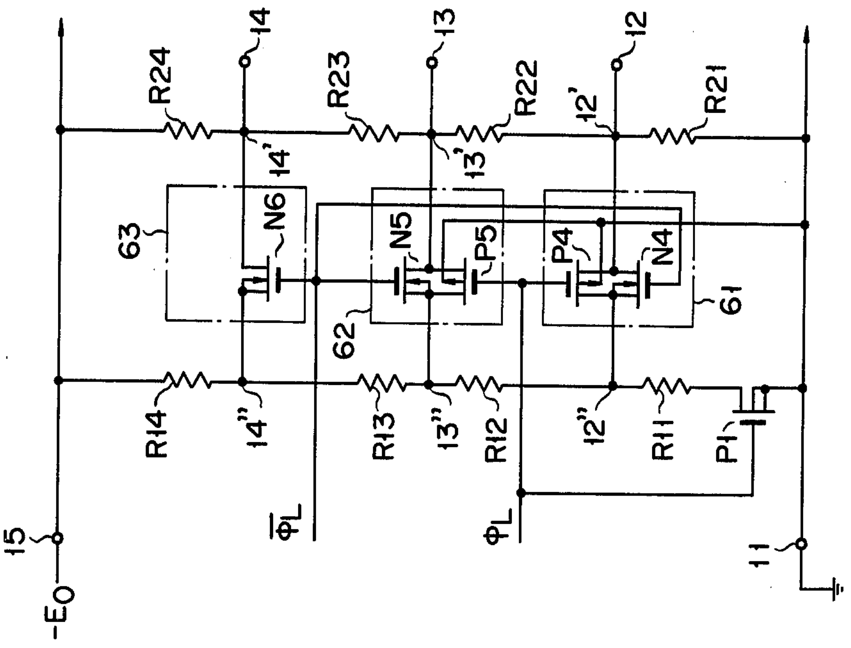

FIG. 12 shows still another embodiment of the invention. In this embodiment, the MOSTs N1, N2 and P2 shown in FIG. 4 are removed. As shown in the figure, transmitting means 61, 62 and 63 are connected between the corresponding dividing points of the respective series connections including the first resistive elements R11 to R14 and the second resistive elements R21 to R24. More particularly, these transmitting means are connected between dividing points 12′ and 12″, 13′ and 13″ and 14′ and 14″. The transmitting means 61 comprises a couple of n- and p-channel MOSTs N4 and P4 connected in parallel. The MOST N4 is connected at the back gate electrode to the dividing point 12″ and coupled at the gate with the pulse $\phi_L$. The MOST P4 is connected at the back gate electrode to ground and coupled at the gate to the pulse $\overline{\phi_L}$. The transmitting means 62 comprises a couple of n- and p-channel MOSTs N5 and P5 connected in parallel. The MOST N5 is connected at the back gate electrode to the dividing point 13″ and coupled at the gate to the pulse $\overline{\phi_L}$. The MOST P5 is connected at the back gate electrode to ground and coupled at the gate to the pulse $\phi_L$. The transmitting means 63 includes an n-channel MOST N6 whose back gate electrode is connected to the dividing point 14″ and whose gate is coupled to the pulse $\overline{\phi_L}$. The MOST N4 of the transmitting means 61 is used to eliminate the back gate bias effect of MOST P4. The MOST N5 of the transmitting means 62 is used to eliminate the back gate bias effect of MOST P5. The MOSTs P1, P4, P5, N4, N5 and N6 used in FIG. 12 are simultaneously enabled or disabled and the circuit of FIG. 12 operates as in the FIG. 4 embodiment.

The voltage dividing circuit of FIG. 12 may be modified variously. For example, an n-channel MOST, in place of the MOST P1, may be connected between the resistive element R14 and the power source terminal 15. In this case, the back gate electrodes of the n-channel MOSTs N4, N5 and N6 are connected to the dividing points 12′, 13′ and 14′ of the series connection of the second resistive elements R21 to R24. Alternatively, both the terminals of the series connection including first resistive elements R11 to R14 may be connected to the terminals 11 and 15, through p- and n-channel MOSTs respectively. In this case, one of the transmitting means 61 to 63 may be omitted. When the transmitting means 62 is omitted the back gate electrodes of MOSTs N4 and N6 may be respectively connected to the dividing points 12″ and 14′ to directly couple the dividing point 13″ to the dividing point 13′.

What is claimed is:

1. A circuit for providing a plurality of potential levels used in dynamically driving a display device comprising:

first and second input terminals for receiving maximum and minimum input potentials, respectively;

a series connection of resistive elements, said connection having a terminal at each end thereof and at least one intermediate junction point;

a first field effect transistor for connecting one end terminal of said series connection to said first input terminal, and a second field effect transistor for connecting the other end terminal of said series connection to said second input terminal;

means for simultaneously enabling and disabling said first and second field effect transistors, so that a current flows from one of said first and second input terminals to the other of said first and second input terminals through said first and second field effect transistors and said series connection of resistive elements when said first and second field effect transistors are enabled;

said enabling and disabling means enabling said first and second field effect transistors for a period of time shorter than the period said field effect transistors are disabled; and at least first, second and third output terminals, said first and second output terminals being connected to said first and second input terminals, respectively, to provide maximum and minimum potential levels, and said third output terminal being connected to an intermediate junction point of said series connection to provide a predetermined intermediate potential level between the maximum and minimum potential levels.

2. A circuit according to claim 1 wherein said first and second field effect transistors are of opposite channel types.

3. A circuit according to claim 1 wherein the number of said resistive elements is four.

4. A circuit according to claim 1 further including a second series connection of resistive elements connected between said first and second input terminals and having the same number of resistive elements as the first series connection, each of the resistive elements in the second series connection being interconnected to a respective one of the resistive elements in the first series connection and having a comparatively larger resistance value.

5. A circuit for providing a plurality of potential levels used in dynamically driving a display device comprising:

first and second input terminals for receiving maximum and minimum input potentials, respectively;

a series connection of N dividing units, where N is greater than 1, connected between said first and second input terminals, each dividing unit having a series connection of a field effect transistor and a resistive element, said series connection having N−1 junction points formed between the N dividing units;

means for simultaneously enabling and disabling said field effect transistors of said dividing units so that a current flows from one to the other of said first and second input terminals through said dividing units when said field effect transistors of said dividing units are enabled; said enabling and disabling means enabling said field effect transistors for a period of time shorter than the period said field effect transistors are disabled; and N+1 output terminals, two of the output terminals being connected to said first and second input terminals, respectively, to provide maximum and minimum potential levels, and the remaining output terminals being connected to the N-1 junction points, respectively, to provide predetermined intermediate potential levels between the maximum and minimum potential levels.

6. A circuit according to claim 5 wherein said dividing units each include an additional resistive element connected in parallel with at least the field effect transistor in the dividing unit and having a resistance value comparatively larger than the resistive element in the dividing unit.

7. A circuit according to claim 6 wherein said field effect transistors are of the insulated gate type and include N-channel and P-channel transistors.

8. A circuit according to claim 7 wherein N is four.

9. A circuit for providing a plurality of potential levels used in dynamically driving a display device comprising:

first and second input terminals for receiving maximum and minimum input potentials, respectively;

a series connection of N dividing units, where N is greater than 1, connected between said first and second input terminals, each dividing unit having a parallel combination of a first series connection of a first insulated gate field effect transistor and a first resistive element and a second series connection of a second insulated gate field effect transistor and a second resistive element whose resistance value is comparatively larger than the resistance value of said first resistive element, said series connection of N dividing units having N−1 junction points formed therebetween, means for simultaneously enabling and disabling said first insulated gate field effect transistors and said second insulated gate field effect transistors, said second insulated gate field effect transistors being simultaneously enabled and disabled at a rate faster than that of said first insulated gate field effect transistors; and N+1 output terminals, two of the output terminals being connected to said first and second input terminals, respectively, to provide maximum and minimum potential levels, and the remaining output terminals being connected to the N−1 junction points, respectively, to provide predetermined intermediate potential levels between the maximum and minimum potential levels.

10. A circuit according to claim 9 wherein said first insulated gate field effect transistors and said second insulated gate field effect transistors include N-channel and P-channel transistors.

11. A circuit according to claim 9 wherein N is four.

12. A circuit for providing a plurality of potential levels used in dynamically driving a display device comprising:

first and second input terminals for receiving maximum and minimum input potentials, respectively;

a first voltage divider network including a plurality of first resistive elements connected in series between said first and second input terminals and having junction points formed therebetween;

a first insulated gate field effect transistor connected in series with said first voltage divider between said first and second input terminals;

a second voltage divider network including a plurality of second resistive elements, equal in number to said first plurality of resistive elements, connected in series between said first and second input terminals, each second resistive element having a resistance value comparatively larger than the resistive value of each first resistive element, said plurality of second resistive element having junction points formed therebetween;

means for connecting the junction points of said first voltage divider network to corresponding junction points of said second voltage divider network, said connecting means including at least one second insulated gate field effect transistor, means for simultaneously enabling and disabling said first and second insulated gate field effect transistors, the period of time said transistors are enabled being shorter than the period of time they are disabled; and first and second output terminals connected to said first and second input terminals, respectively, to provide maximum and minimum potential levels, and at least one other output terminal connected to respective junction points of said second voltage divider network to provide predetermined intermediate potential levels between the maximum and minimum potential levels.

13. A circuit according to claim 12 wherein the number of said first resistive elements is four and the total number of output terminals is five.

14. A circuit for providing a plurality of potential levels used in dynamically driving a display device comprising;

first and second input terminals for receiving maximum and minimum potentials, respectively;

a first voltage divider network including four first resistive elements connected in series between said first and second input terminals and having three junction points formed therebetween;

at least one first insulated gate field effect transistor connected in series with said first voltage divider network between said first and second input terminals;

a second voltage divider network including four second resistive elements connected in series between said first and second input terminals and having three junction points formed therebetween, the resistance value of each second resistive element being comparatively larger than the resistive value of each first resistive element;

means for connecting the junction points of said first voltage divider network to corresponding junction points of said second voltage divider network, said connecting means including at least one second insulated gate field effect transistor connected between each of said corresponding junction points of the first and second voltage divider networks;

means for simultaneously enabling and disabling said first and second insulated gate field effect transistors, the period of time said transistors are enabled being shorter than the period of time they are disabled;

first and second output terminals connected to said first and second input terminals, respectively, to provide maximum and minimum potential levels; and third, fourth and fifth output terminals connected, respectively, to the three junction points of said second voltage divider network to provide predetermined intermediate potential levels between the maximum and minimum potential levels.

15. A circuit according to claim 14 wherein said connection means further includes two additional insulated gate field effect transistors connected respectively in parallel with two of said second insulated gate field effect transistors and each being of a channel type opposite to that of the second insulated gate field effect transistor with which it is in parallel.

16. A circuit for providing a plurality of potential levels used in dynamically driving a display device comprising:

first and second input terminals for receiving maximum and minimum potentials, respectively;

a voltage dividing network connected between said first and second input terminals and including first, second, third and fourth dividing units connected in series and having three junction points formed therebetween, each of said dividing units including a series connection of a first insulated gate field effect transistor and a resistive element, said insulated gate field effect transistors of said first and second dividing units being N-channel type, and said insulated gate field effect transistors of said third and fourth dividing units being of P-channel type;

a second insulated gate field effect transistor of N-channel type connected in parallel with said P-channel insulated gate field effect transistor of said third dividing unit, means for simultaneously enabling and disabling said first and second insulated gate field effect transistors, the period of time said transistors are enabled being shorter than the period of time they are disabled; and first and second output terminals connected to said first and second input terminals, respectively, to provide maximum and minimum potential levels, and third, fourth and fifth output terminals connected to the three junction points, respectively, to provide predetermined intermediate potential levels between the maximum and minimum potential levels.

17. A circuit according to claim 16 wherein each dividing unit includes an additional resistive element connected in parallel with the series connection and having a resistance value comparatively larger than that of the resistive element.

* * * * *